United States Patent [19]

Mayer

[11] Patent Number: 4,662,754
[45] Date of Patent: May 5, 1987

[54] METHOD FOR FACILITATING THE ALIGNMENT OF A PHOTOMASK WITH INDIVIDUAL FIELDS ON THE SURFACES OF A NUMBER OF WAFERS

[75] Inventor: Herbert E. Mayer, Eschen, Liechtenstein

[73] Assignee: The Perkin-Elmer Corporation, Norwalk, Conn.

[21] Appl. No.: 811,788

[22] Filed: Dec. 20, 1985

[51] Int. Cl.$^4$ ............................................. G03B 27/42
[52] U.S. Cl. ..................................... 356/401; 355/53
[58] Field of Search ....................... 356/399, 400, 401; 250/548; 355/43, 53

[56] References Cited

U.S. PATENT DOCUMENTS

| | | | |
|---|---|---|---|
| 4,345,836 | 8/1982 | Phillips | 355/53 |
| 4,362,385 | 12/1982 | Lobach | 356/401 |
| 4,504,144 | 3/1985 | Trost | 355/53 |
| 4,573,791 | 3/1986 | Phillips | 356/401 |

Primary Examiner—R. A. Rosenberger
Attorney, Agent, or Firm—Thomas P. Murphy; Edwin T. Grimes; Francis L. Masdelle

[57] ABSTRACT

Described is a method for facilitating the alignment of a photomask with individual fields on the surfaces of a number of wafers onto which fields the pattern of the photomask is to be imaged for projection printing, each of said number of wafers carrying an identical array of fields produced in at least one previous printing process. For this purpose it is possible to choose one out of the identical batch of wafers, measure the rotational adjustment necessary to bring each field into the correct direction in the horizontal plane and to use the measured value for an automatic rotational adjustment of all other wafers of the batch.

2 Claims, 13 Drawing Figures

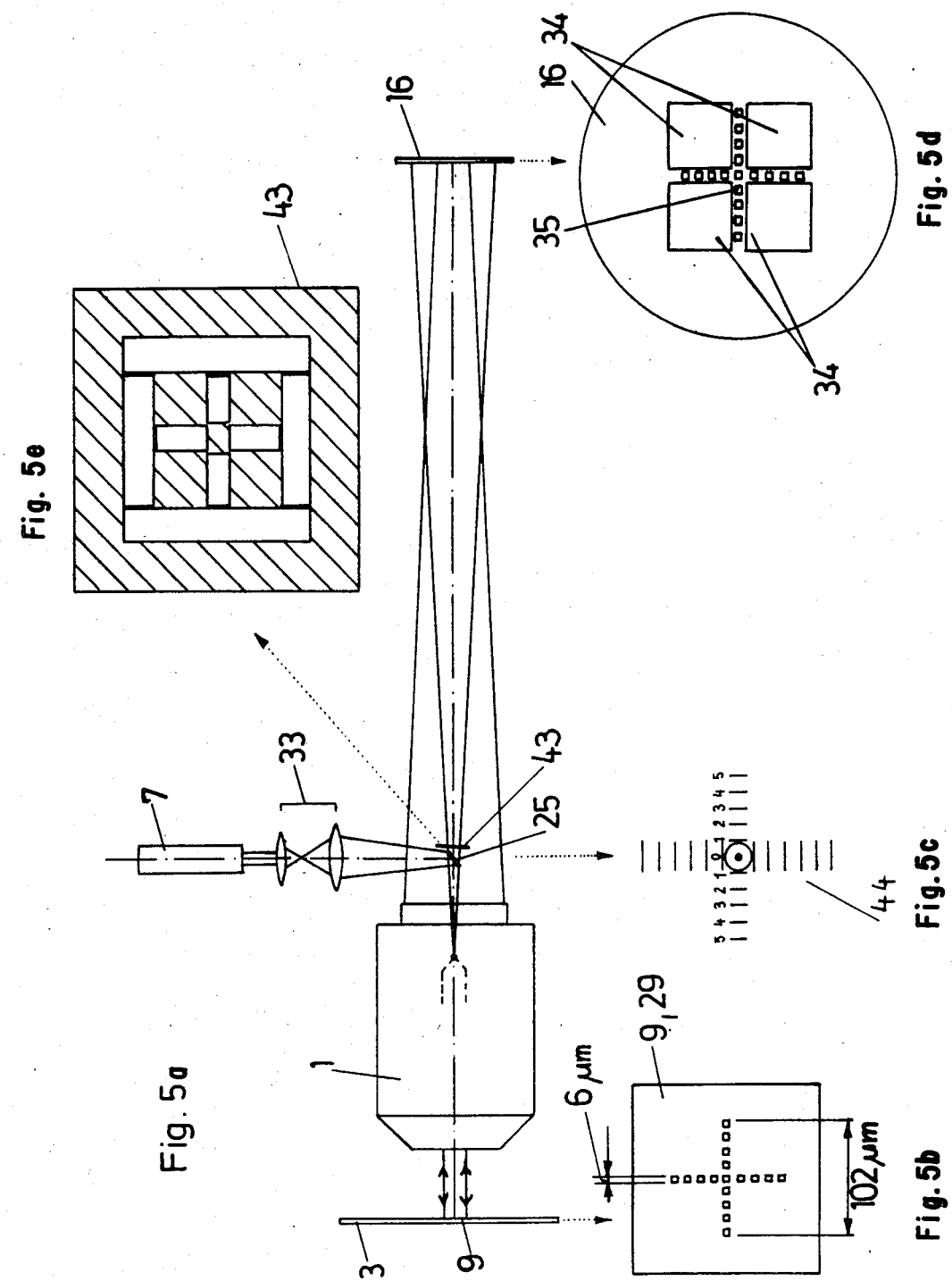

METHOD FOR FACILITATING THE ALIGNMENT OF A PHOTOMASK WITH INDIVIDUAL FIELDS ON THE SURFACES OF A NUMBER OF WAFERS

FIELD OF THE INVENTION

My present invention relates to a method for facilitating the alignment of a photomask with individual fields on the surfaces of a number of wafers onto which fields the pattern of the photomask is to be imaged for projection printing, each of said number of wafers carrying an identical array of fields produced in at least one previous printing process.

BACKGROUND OF THE INVENTION

In a production of semiconductor circuit elements, workpieces in the form of semiconductor wafers are generally coated with a photosensitive layer and are exposed by an appropriate optical system effecting image reduction in a pattern determined by a mask so that subsequent development and treatment may establish certain conductive or nonconductive paths on the wafer and/or from circuit elements thereon.

In many cases, circuit elements have already been formed on the wafer before such exposure so that during the exposure a precise positioning of the semiconductor wafer relative to the mask is essential for proper correlation (overlay) of successively formed circuit patterns.

To effect this correlation it is known to align the wafer by imaging into each other corresponding alignment marks on the mask and alignment patterns on the wafer by means of alignment light reflected from the water. If the alignment patterns on the wafer are related to the wafer as a whole and not to its individual fields this process is known as global alignment. Following global alignment the wafer is displaced in two orthogonal directions (X,Y) to bring the next field on the wafer into proper position for exposure after exposure of another field has been completed. The amount by which the wafer is displaced in either direction is predetermined, it corresponds to the distance between the individual fields which is supposed to be known. In order to correct the error due to the difference between an actual distance of the fields and its assumed value sophisticated devices incorporate means for the alignment of each individual field of the wafer after is has been brought into an approximately correct position by global alignment and "blind" diplacement in steps of predetermined lengths. For this purpose field alignment marks are associated with every field on the wafer which make it possible to correct the position of the field in cartesian and angular coordinates X, Y and $\phi$ and in the direction of the optical axis.

The methods described so far can be improved if a way is found to make the predetermined value of the steps, which bring each field into approximate alignment, as ideal as possible. The main reason why this predetermined value needs correction seems to be that the length of the steps required to bring subsequent fields on a wafer under the object lens is found to change, if a certain wafer is repeatedly exposed. This happens not only if different machines are used for successive printing processes but also if a single machine has changed its dimensions, e.g. because of temperature changes. A method has to be found to take into consideration the difference of scale between the machines used for a previous exposure of a wafer and the exposure to be effected. Assuming that any number of wafers prepared in a uniform process on a single machine shows an identical array of fields the different scale of the processing equipment can be compensated by measuring for one of the wafers the length of the steps in X- and Y-direction, which are necessary to reach coincidence of the field alignment marks with the marks on the mask and to use the length of the steps with thus has been found by measurement for one wafer for the "blind" stepping of all subsequent wafers.

Applicant applied the scaling procedure just described and observed that it makes it possible to bring one of the field alignment marks associated with the different fields on the wafer into proper alignment. However, a rotational alignment error remained, i.e. the pattern on the mask and the pattern on the corresponding field on the wafer had slightly different directions. So far this error had not attracted much attention and the only measure to minimize it had been a rotation of the wafer as a whole during global alignment.

Upon close inspection of the problem it was found that the rotational alignment error can only be reduced but cannot be eliminated by global alignment, because it differs for the different fields on the surface of a single wafer. At first it was thought that the deviations are erratic, as there is no obvious regularity in their appearance. This would mean that the rotational alignment error remaining after global rotational alignment could only be corrected separately for every field. Surprisingly it was then found that the seemingly erratic rotational alignment errors appear almost identically on every wafer out of a batch that was produced on a single machine. This makes it possible to choose one out of the identical batch of wafers, measure the rotational adjustment necessary to bring each field into the correct direction in the horizontal plane and to use the measured value for an automatic rotational adjustment of all other wafers of the batch.

As explained the invention is based on the insight that the fields on any wafer have slightly differing orientations but that corresponding fields on two different wafers are equally directed provided the wafers have been produced in a uniform process on a single device. This makes it possible to prepare one out of a batch of otherwise identical wafers in such a way that the orientation of its fields may be easily checked. In this sense it is advantageous to leave one wafer without a photosensitive cover which allows for fast detection of the marks on its surface. Of course, further processing of this master wafer would only be possible if it was subsequently covered with a photosensitive layer.

The success of the inventive method proves that there is a systematic cause for the rotational deviations among the printed fields of a wafer. An assumption concerning the nature of this cause shall be discussed in connection with the drawings.

BRIEF DESCRIPTION OF THE DRAWINGS

FIG. 5 shows in a schematically simplified form the beam path of the light which leads to the copying of an adjusting mark of the wafer onto the sensor attached to the mask frame.

DETAILED DESCRIPTION OF THE PREFERRED EMBODIMENTS

Figure 1:
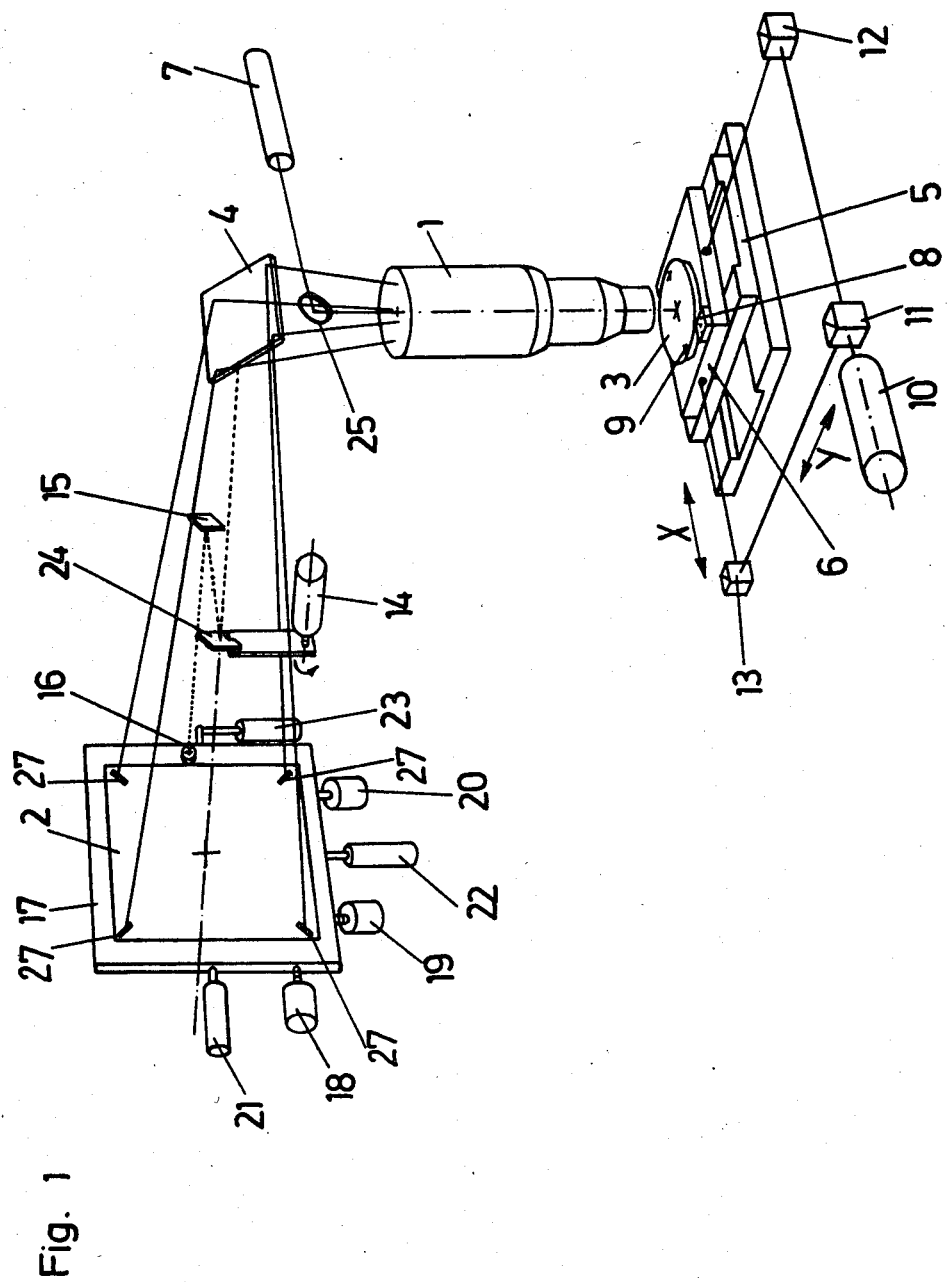
FIG. 1 is an overview of the total arrangement of a device for projection copying of masks on a semiconductor wafer.

FIG. 1 shows the important parts of an apparatus for the partial exposure of a semiconductor substrate. The workpiece 3 lies on a base table 6, which is in the form of a slide block and is adjustable parallel to the direction denoted with Y. It is carried by a slide block 5, which can also be adjusted in the X direction. These movements are controlled by interferometers 12 and 13, which form a part of a known laser interferometer along with the laser 10 and the beam-splitter 11. The exposure of the wafer 3 takes place in that a pattern of the mask 2 is projected onto the wafer by way of the deviation mirror 4 and the projection lens 1. During this exposure process which changes the photo lacquer on the wafer 3 according to the pattern of the mask, the mirrors 24 and 15, as well as the mirror 25, which serve exclusively for the setting of the opposing position of mask 2 and wafer 3, are located outside of the beam path of the exposure light. In order to align the wafer opposite the mask 2, marks 9 are made on the wafer 3 and marks 27 are made on the mask. Further marks are found on the adjusting plate 8 found on the base table 6, and the center of sensor 16, which is on the underside of the frame 17 of mask 2, can also be taken as a mark.

The opposing alignment of the mask 2 and the workpiece 3 by means of the arrangement shown takes place in that first the marks 27 of the mask 2 are imaged onto the adjusting plate 8 by means of adjusting light which comes from a light source (not shown) behind mask 2, after this has been slid under projection lens 1. The details of this actually well-known adjustment process are further described by way of FIGS. 2 to 4.

After the alignment of mask 2 relative to the adjustment plate 8, the mirrors 24 and 15 are brought into the position shown in FIG. 1 by a pivot device, and the mirror 25 is brought into this position by way of a similar pivoting device, which is not shown for reasons of economy. A mask in the center of the adjusting plate 8 is then illuminated by means of the adjusting laser 7 by way of the deviation mirror 25 and the projection lens 1. The mirror 25 is elliptical, whereby its projection in the direction of the optical axis is spherical. The light directly reflected by the mark onto the adjusting plate 8 then reaches, in a manner more precisely described through FIG. 5, sensor 16 by way of mirrors 24 and 15 only insofar it is not masked out by the deviation mirror 25. The sensor 16 is position-sensitive, that is, the signal given by it gives an indication of the precision with which the light strikes the center of the sensor.

Since the relative position of the marks on the adjusting plate 8 is well-known, the alignment of the mask 2 to the adjusting plate 8 and the determination of the relative position of the sensor 16 to the adjusting plate 8 allows the relative position of mask 2 and frame 17 to be clearly determined. If with this the base table 6 or the frame 17 including the mask 2 must be removed, the corresponding displacements are registered by the laser interferometers 10 to 13 or by the length sensors 21 to 23, which determine the position of the frame parallel to the frame corner and in direction of rotation. The alignment of the wafer 3 can only take place in that the adjustment marks 9 on the wafer 3 are slid under the projection lens 1. The precise alignment of the wafer 3 does not then take place by displacements of the slide blocks 5 and 6 which have to be extremely small due to the reduction effect of the projection lens, but by the displacement of the frame 17 by means of the propulsions 18 to 20. These change the position of the frame 17 parallel to its corners as well as its angular position in the frame plane until the light scattered by the adjusting mark 9 on the wafer 3 is centered on the sensor 16. This centering also takes place by exposure by laser 7, whereby the deviation mirror 25 also makes out the directly reflected beams.

Figure 2:
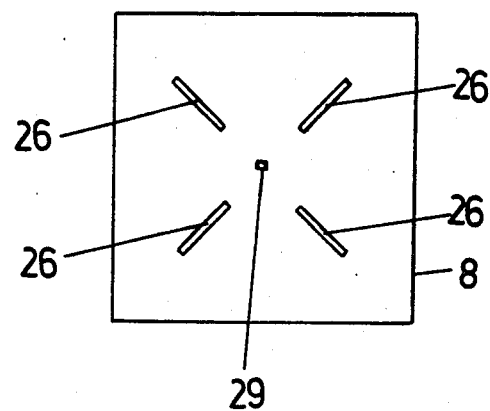
FIG. 2 is a top view of an adjusting plate carrying a reference mark.

As has been mentioned, an adjusting plate 8 as is shown in FIG. 2 in detail serves for the well-known opposing alignment of mask 2 and adjusting plate 8, which forms the first step of the described adjusting process. This is a glass plate whose corner length can be 10 mm, for instance, and those thickness has a magnitude of 1 mm. On this glass plate there is a chromium layer of 0.5 μm in which transparent zones have been etched and on which the images 27 of the mask 2 are to be copied by the projection lens 1. The width of the transparent zones 26 can be 1.5 μm for instance, their length 2 mm. The measurements of the appertaining images 27 of the mask, given a projection ratio of 10:1, are of course ten times larger.

The mask 29 used in dark field adjustment on the adjusting plate 8 is only described in detail in connection with FIG. 5.

Figure 4A:
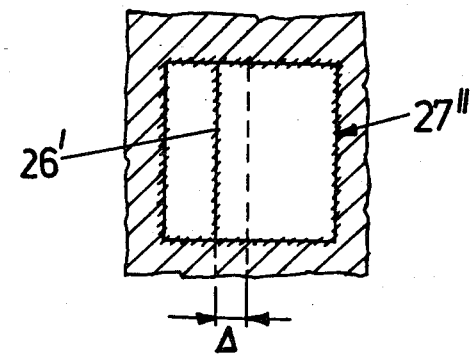
FIG. 4 shows the signal received by the device according to FIG. 3.
Figure 4B:
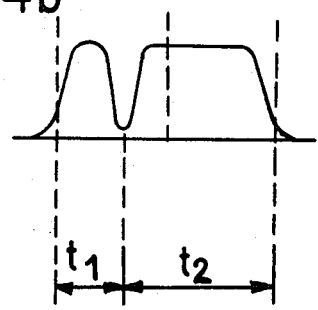
Figure 3A:
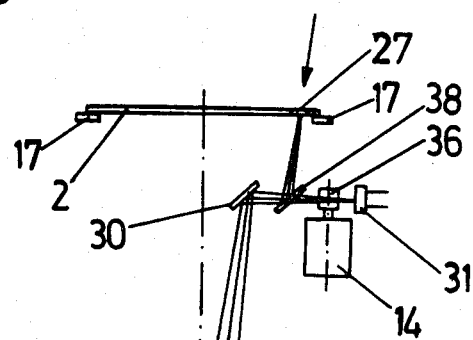
FIG. 3a is a detailed view of FIG. 3.
Figure 3B:
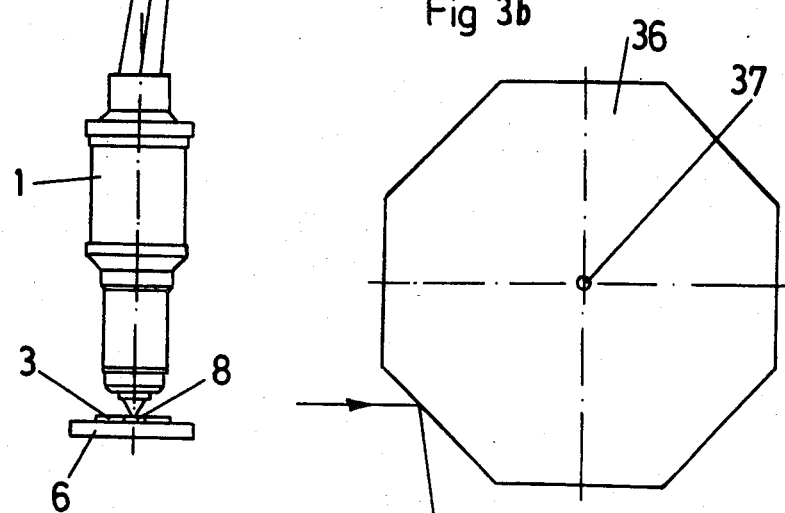
FIG. 3 is a view of a known device for the direct alignment of the mask with the wafer or the adjustment plate.
Figure 3C:
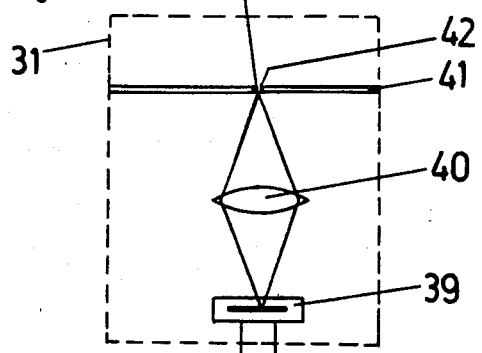

The direct alignment of images 27 of mask 2 and the marks 26 onto the adjusting plate 8 takes place by means of the known device according to FIG. 3, in that a pair of mirrors 30 and 38 is pivoted in that region which must be held free in projection exposure of the wafer 3 in order not to disturb the exposure process. Adjusting light, which typically has a wavelength of 547 or 578 nm and therefore does not affect the photo lacquer on wafer 3 in any significant way, is directed onto a window 27 in the mask 2. The adjusting light reaches the adjusting plate 8 by way of the half-transparent mirror 38 and the deviation mirror 30 through the projection lens 1. If then a window 27 in mask 2 is projected on their marks, then the original image of the pattern shown in FIG. 4 appears on the adjusting plate 8. This is then cast by means of the mirror 30 onto the rotating mirror 36 through the half-transparent mirror 38. This one turns on its axis 37, whereby the back-projected image 27" of the mark 27 and the image 26' of mark 26 is led over the sensor plane 41 of the sensor 31 which has a slit 42. The slit 42 is projected onto a sensor 39 by way of a lens 40, and the sensor gives off an electric signal proportional to the received light intensity. The image shown in FIG. 4 is then scanned in the transverse direction. The corresponding signal then increases when the back-projected image of the window 27 reaches the area of slit 42 and decreases after time t1 when the image of the mark 26 dims the slit 42. From the ratio $t_1:t_2$ the deviation of the mark 26 from the ideal position can be determined, in which this marks lies exactly in the center of the image 27' of the window 27 on the adjusting plate 8. The determination of the position of the sensor 16 relative to the adjusting plate 8 takes place in the same way as the determination of the position of the workpiece 3 relative to the sensor 16. What has been said in the following description of FIG. 5 in connection with the adjusting mark 9 on the wafer 3, also applies for the mark 29 on the adjusting plate 8.

During the adjusting process, the exposure of mark 9 takes place by means of the adjusting light which emanates from a He-Ne laser 7, whereby the light beam is broadened at first by an optical device 33 and then deviated in the direction of the optical axis of the projection lens 1 by means of a small deviation mirror 25. The light coming from laser 7 falls as a parallel liminous beam on mark 9 and is then reflected by it on the one hand, and scattered by it on the other. The diffraction image 44 shown in a simplified form in FIG. 5 is then produced in the plane of the deviation mirror 25, whose zero order is masked out by means of the mirror 25. So that this masking out takes place symmetrically, the tilted mirror 25 has an elliptical form. The light scattered by the mark 29 in the region of the projection lens 1 far from the axis then falls within the dark field produced by the mirror 25 onto the sensor 16.

In order to guarantee that only the diffraction image 44 and not additional disturbing light scatter which does not originate from the mark 9 reaches the sensor 16, a screen 43 is installed immediately behind mirror 25, which only allows the diffracted light coming from mark 9 to pass.

If mark 9 has the form of a cross as is shown in FIG. 5, then its image 35 on the sensor 16 is also crosslike. Each of the four quadrants of the diode then emits a signal which is dependent on the light intensity and the size of the exposed surface, which ideally should be zero. The mark 9 is then oriented in relation to the diode, when the signals which have been sent from the individual quadrants 34 are equally small.

What has been described so far is what I consider the best mode of the global alignment of a wafer 3. Any other known method for globally aligning the wafer 3 might alternatively be used in connection with the method according to the invention.

Figure 6:
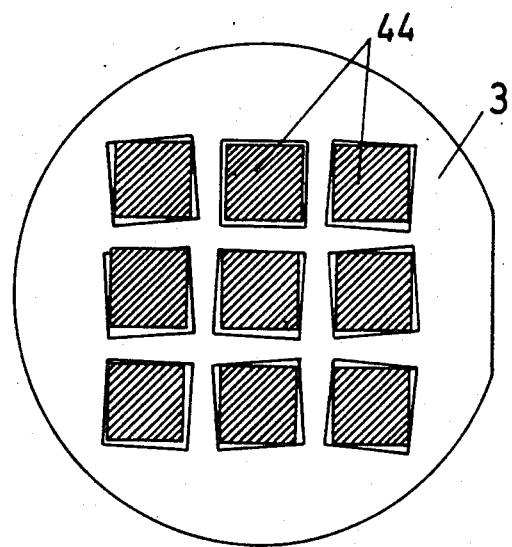
FIG. 6 shows a wafer with two arrays of fields in poor angular alignment.

Following the global alignment wafer 3 is moved in predetermined steps in the directions indicated by X and Y in FIG. 1. The surface of the wafer is hereby repeatedly illuminated in a pattern which corresponds to the pattern on mask 2. Afterwards this first pattern is made permanent by known processes. Afterwards a mask 2 showing a different pattern is inserted and the exposure of the wafer is repeated. Hereby it is essential that the patterns produced by the two different masks are exactly correlated. However, if after the global alignment described above the wafer 3 is moved in directions X and Y through a correctly calculated distance there is still no perfect overlay of the pattern that has been printed on the wafer 3 and the one that is to be printed on it. The result is rather as shown in FIG. 6, where the fields 44 printed during the first run appear in white and the fields to be printed in a second run have been darkened. Obviously the directions of the fields produced during the first run are at varying angle with the fields to be printed.

Figure 7:
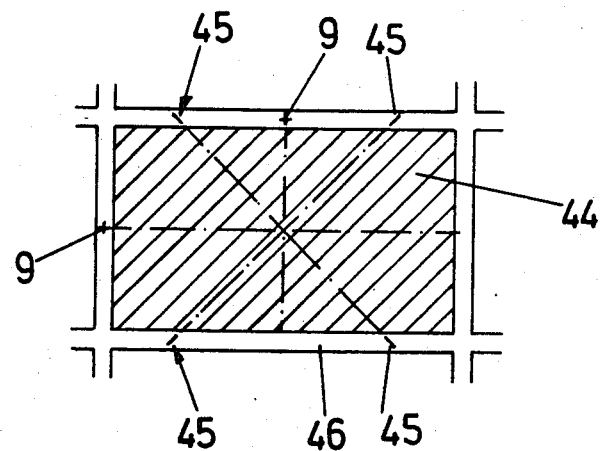
FIG. 7 shows an individual field on a wafer surface.

The invention intends to assure that the image of the second or any following pattern on the mask 2 coincides with the previously printed pattern also as far as its orientation in the X-Y plane is concerned. For this purpose out of a batch of identically patterned wafers one is chosen which carries not only global alignment marks 9 but also field-by-field alignment marks 45 (cf. FIG. 7) associated with each field 44. These marks are positioned in scribe lanes 46, which separate the individual fields 44. This master wafer is now stepped in X- and Y-direction at predetermined amounts in order to bring different fields 44 under the lens 1. In addition the equipment described in detail in connection with FIGS. 2-4 is used to determine the rotational adjustment which is necessary to align the image of the new pattern on mask 2 with the image already printed on the wafer. Perfect angular alignment has been achieved if at least two of the field alignment marks 45 associated with a certain field 44 are properly correlated with the corresponding marks 27 on mask 2.

The information gained from measuring the necessary rotational adjustments for one wafer may be used for the proper directional alignment of a batch of identical wafers. After global alignment these wafers are not only moved in X- and Y-directions for an appropriate distance but in addition they are rotated relative to the mask 2 through an angle which brought the master wafer into proper angular alignment.

After the process described has been carried out there may still be a field-by-field alignment if maximum accuracy is required. Generally this field-by-field alignment will, however, be made superfluous and in any case it takes a much shorter time if due to the invention a very good approximation of the perfect position has been reached before such field-by-field alignment takes place.

What now concerns the reason why the inventive method is actually successful it might well be that it rests in the difficulty of making perfect mirrors which for the interferometers 12 represents the wafer 3. If the reflecting sides on the base table 6 are even slightly curved the fields 44 on a wafer 3 will show different orientations. Processing on another machine which tends to produce other and again differing orientation of the fields would cause the seemingly irregular pattern shown in FIG. 6, which is corrected by the invention.

While the invention has been described with reference to its preferred embodiments, it will be understood that modifications and variations will occur to those skilled in the art. Such modifications and variations are intended to fall within the scope of the appended claims.

What is claimed is:

1. A method for facilitating the alignment of a photomask with individual fields on the surfaces of a number of wafers onto which fields the pattern of the photomask is to be imaged for projection printing, each of said number of wafers carrying an identical array of fields produced in at least one previous printing process, the method comprising the steps of:
   (a) choosing one of said wafers and successively bringing each of the fields printed on its surface into alignment with the mask;
   (b) measuring the rotational adjustment with respect to an axis perpendicular to the wafer's surface which was necessary to bring each field into proper angular relationship with the mask; and
   (c) making the same rotational adjustment when bringing the corresponding field on the surface of any other wafer out of said number into alignment with the mask.

2. A method as defined in claim 1 wherein the measurement of the rotational adjustment which is necessary between successive fields on the wafers is carried out on a wafer which unlike the others is not covered by a photosensitive layer.

* * * * *